(12) United States Patent
Schwarzl

(10) Patent No.: US 6,872,495 B2
(45) Date of Patent: Mar. 29, 2005

(54) METHOD FOR FABRICATING A LITHOGRAPHIC REFLECTION MASK IN PARTICULAR FOR THE PATTERNING OF A SEMICONDUCTOR WAFER, AND A REFLECTION MASK

(75) Inventor: Siegfried Schwarzl, Neubiberg (DE)

(73) Assignee: Infineon Technologies AG, Munich (DE)

(*) Notice: Subject to any disclaimer, the term of this patent is extended or adjusted under 35 U.S.C. 154(b) by 278 days.

(21) Appl. No.: 10/147,543

(22) Filed: May 16, 2002

(65) Prior Publication Data

US 2002/0192571 A1 Dec. 19, 2002

(30) Foreign Application Priority Data

May 16, 2001 (DE) .......................................... 101 23 768

(51) Int. Cl.⁷ .............................. G03F 9/00; G21K 5/00
(52) U.S. Cl. ............................................. 430/5; 378/35
(58) Field of Search ............................. 430/5; 40/322; 378/34, 35

(56) References Cited

U.S. PATENT DOCUMENTS 5,411,824 A * 5/1995 Vasudev et al. ............... 430/5
6,645,679 B1 * 11/2003 La Fontaine et al. ........... 430/5

FOREIGN PATENT DOCUMENTS

EP 0279670 A2 8/1988

OTHER PUBLICATIONS

John E. Bjorkholm: "EUV Lithography—The Successor to Optical Lithography?", *Intel Technology Journal, 3rd quarter 1998*, pp. 1–10.

* cited by examiner

*Primary Examiner*—S. Rosasco
(74) *Attorney, Agent, or Firm*—Laurence A. Greenberg; Werner H. Stemer; Ralph E. Locher

(57) ABSTRACT

A method for fabricating a lithographic reflection mask in particular for patterning of semiconductor wafers, is described, and can be used for extremely small feature sizes below 100 nm. In known lithographic methods with EUV radiation (extreme ultraviolet), for the mask fabrication, a multilayer reflection layer is applied to a substrate. An absorber layer is deposited after the multilayer layer is patterned above the multilayer layer or is completely introduced into the latter. In the case of the method according to the invention, in contrast, the absorber layer is applied between the substrate and the reflection layer and/or on the side areas of the reflection layer. This has the advantage of reducing CD changes due to shadowing of structures lying above the reflection layer. Further advantages are, inter alia, smaller structure displacements and reduced asymmetrical intensity profiles of the reflected beams of radiation.

43 Claims, 9 Drawing Sheets

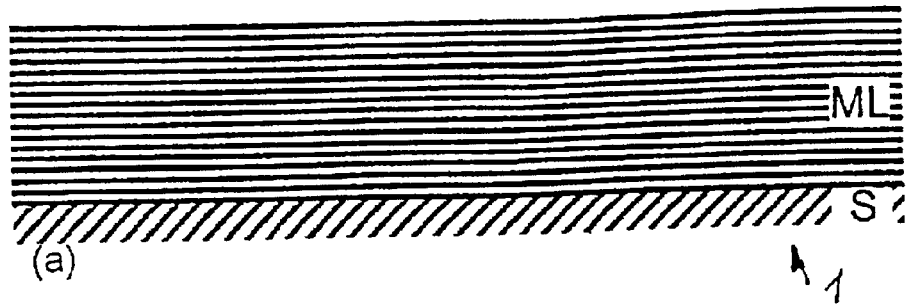
(a) Fig. 3A Prior Art
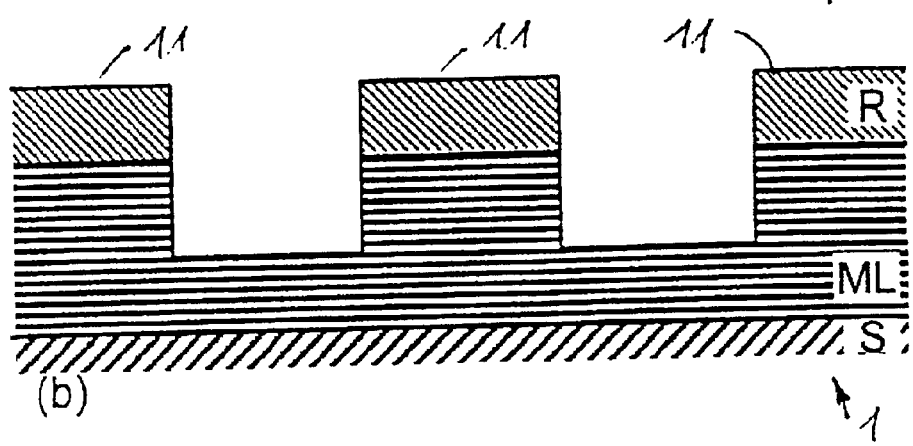
(b) Fig. 3B Prior Art
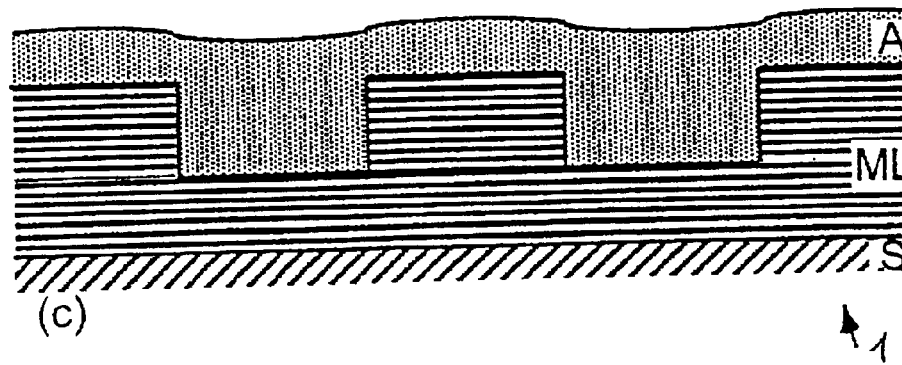
(c) Fig. 3C Prior Art
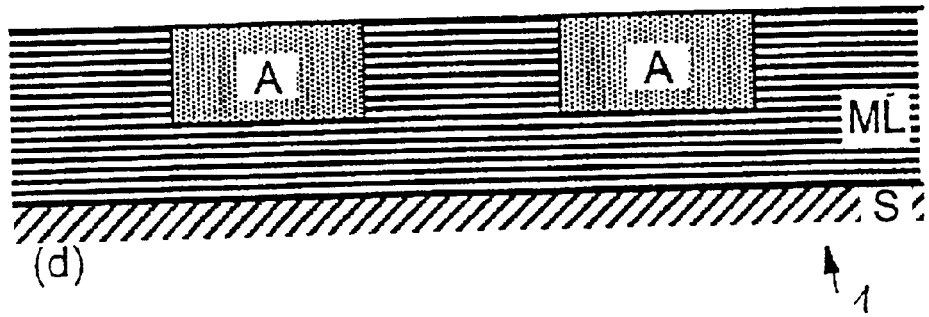
(d) Fig. 3D Prior Art

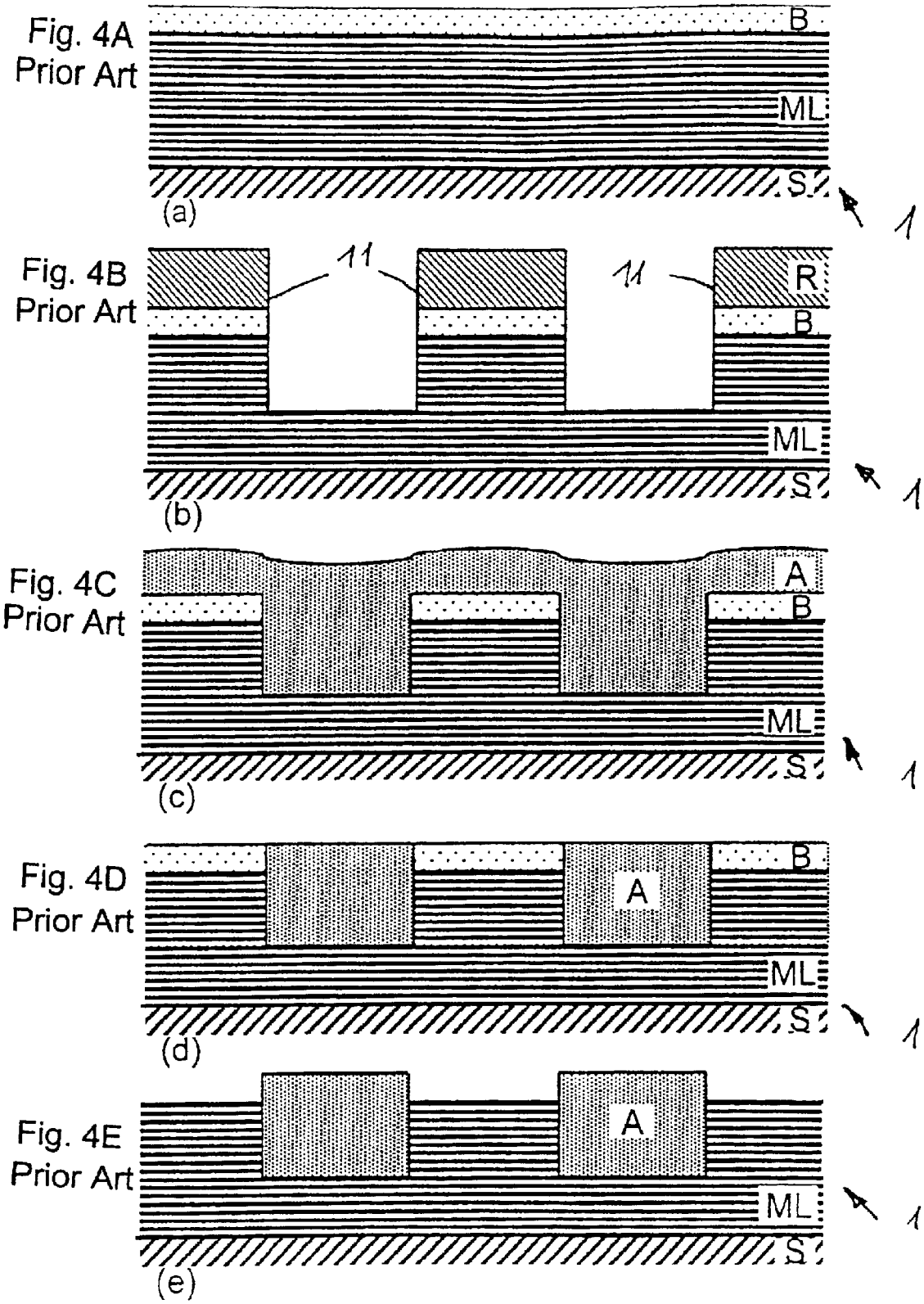

(a)

(b)

(c)

(d)

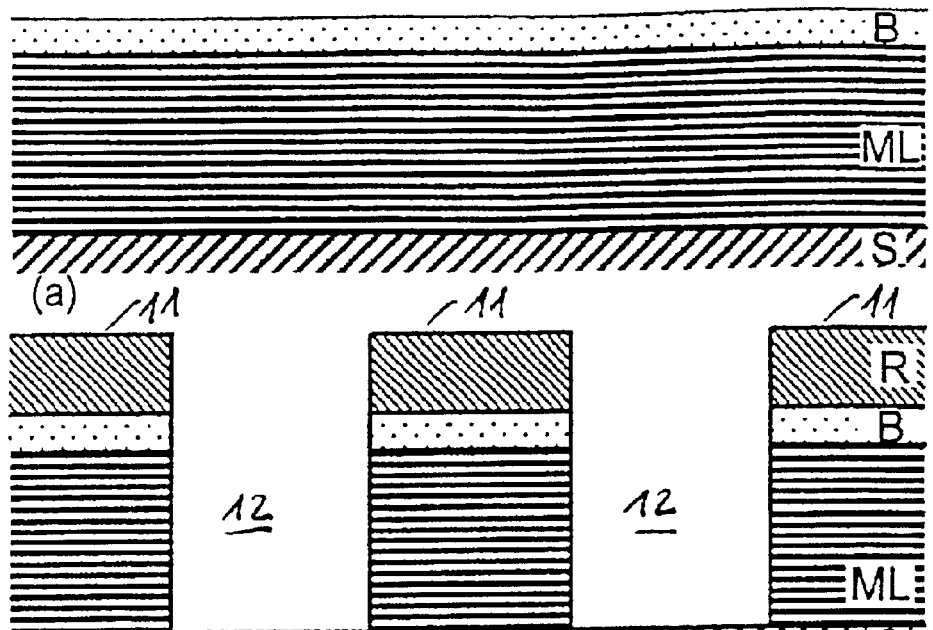
Fig. 8A
Fig. 8B
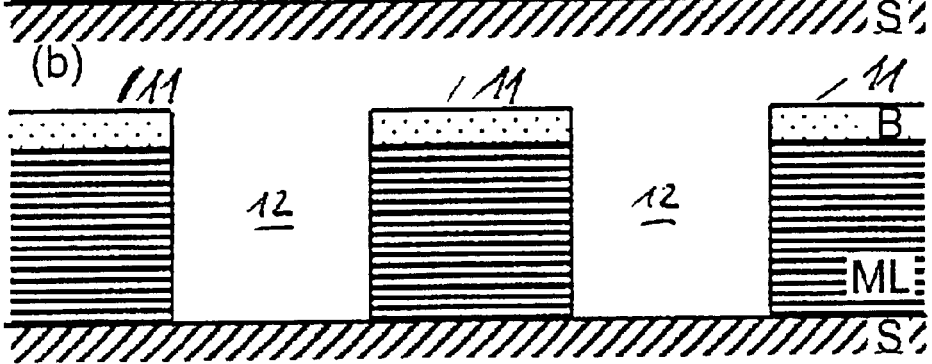
Fig. 8C
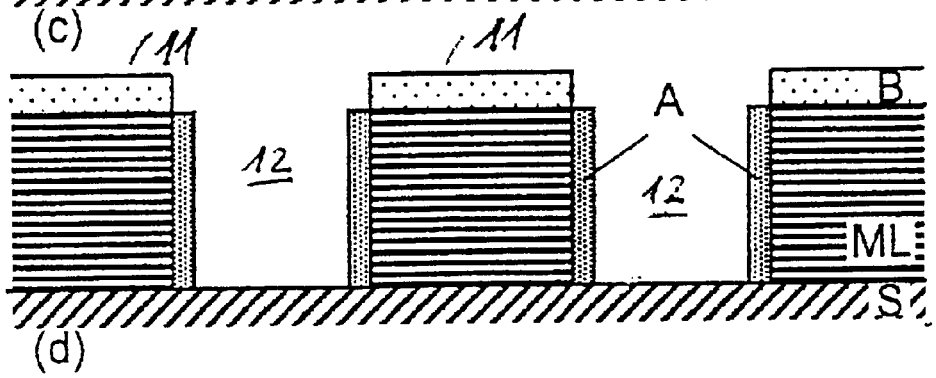
Fig. 8D
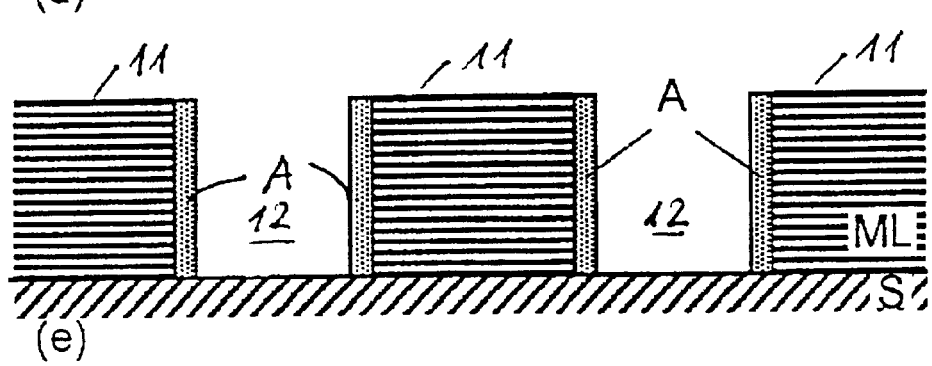
Fig. 8E

METHOD FOR FABRICATING A LITHOGRAPHIC REFLECTION MASK IN PARTICULAR FOR THE PATTERNING OF A SEMICONDUCTOR WAFER, AND A REFLECTION MASK

BACKGROUND OF THE INVENTION

Field of the Invention

The invention is based on a method for fabricating a lithographic reflection mask, in particular for feature sizes below 100 nm. For the fabrication in particular of semiconductor chips on a silicon wafer (wafer), it is already known to use reflection masks that contain the structures that are projected onto the wafer. In order to optimize and reduce fabrication costs, the semiconductor industry endeavors to make the feature sizes on the semiconductor chips as small as possible. The miniaturization of the structures allows more transistor functions to be realized in an extremely small space.

Known optical lithography methods enable feature sizes of approximately 100 nm to be controlled in terms of production engineering. However, goals for the next few years are for the feature sizes to be considerably reduced; by way of example, line widths of 35–70 nm are sought for extremely small structures. Known optical lithography methods, in which wavelengths of 157 nm are used, for example, can no longer be employed for the small structures since a technologically and economically dictated limit is reached for the wavelength with a resolution of approximately 70 nm that can presumably be obtained.

In order to achieve smaller feature sizes, it has already been proposed to use a shorter-wave radiation in particular in the extreme ultraviolet region (EUV radiation). An extreme ultraviolet lithography method (EUVL method) has been disclosed in which use is made of a soft X-ray radiation in the range from 10 nm to 14 nm. Since no refractive materials (lenses) exist for the radiation, multilayer-coated reflection elements are used in the corresponding exposure systems (stepper, scanner) for the illuminator, the imaging optical configuration and the mask. The structures on the reflection mask are imaged with their size reduced on the wafer by EUV radiation which is incident obliquely on the mask and reflected there and a multimirror optical configuration.

Such an EUVL method is disclosed for example in the publication by John E. Bjorkholm, titled "EUV Lithography—The Successor to Optical Lithography?", Intel Technology Journal, 3rd Quarter 1998. The publication proposes a four-mirror projection system which is used for ultraviolet radiation with a wavelength of 10–14 nm. For first experiments, a Schwarzschild mirror system with oblique illumination of the reflection mask was used in order to prevent shadowing of the EUV radiation by the mirrors. As a result, only small mirror partial areas outside the optical axis are utilized, resulting in an effective numerical aperture (NA) of approximately 0.07. In this case, the structures on the mask are imaged with their size reduced by the factor 10 on the wafer.

Furthermore, two fabrication methods for an EUVL mask have been disclosed, which are patterned using an absorber etching process or using the so-called "damascene" method. The two methods proceed from a mask substrate to which a multilayer layer is applied as a reflection layer. In the case of the first-mentioned method, a buffer layer is deposited onto the multilayer layer and an absorber layer is then deposited onto the buffer layer. By use of electron beam lithography using corresponding etching methods known per se, the structures are transferred to the absorber layer or the buffer layer.

In the case of the second-mentioned method, the multilayer layer is patterned by electron lithography and with the assistance of anisotropic etching methods. The resultant depressions in the multilayer layer are completely filled with absorber material by deposition of an absorber layer and subsequent polishing ("damascene technique").

The patterned mask blanks produced according to the methods outlined above then later serve in both methods as imaging objects that are projected with their sizes reduced onto the wafer. Depending on the fabrication method used, the absorber layer deposited after the multilayer layer is completely inserted into the reflection layer or disposed above the latter.

What is disadvantageous, however, in the case of the two methods mentioned above is that shadowing effects of the structures lying above the reflection layer, which are caused by the absorber and buffer layers, cause or amplify disturbing imaging errors (structure width alterations and structure displacements).

Furthermore, the fact that asymmetrical intensity profiles of the reflected radiation are produced during oblique irradiation is unfavorable. The profiles are amplified by the fact that a part of the reflected radiation passes under the buffer and absorber layers and is absorbed there and can thus lead to asymmetrical resist structures on the wafer.

A further problem is seen in the fact that, as a result of different thermal expansion coefficients of the mask materials, temperature gradients arise both during the deposition of the materials and during operation, which generate mechanical stresses and distortions and which can likewise lead to structure alterations. Moreover, these stresses can also lead to structure alterations in the multilayer layer and at the same time alter the reflectivity of the multilayer layer.

SUMMARY OF THE INVENTION

It is accordingly an object of the invention to provide a method for fabricating a lithographic reflection mask in particular for the patterning of a semiconductor wafer, and a reflection mask that overcome the above-mentioned disadvantages of the prior art methods and devices of this general type.

With the foregoing and other objects in view there is provided, in accordance with the invention, a method for fabricating a lithographic reflection mask. The method includes providing a substrate and applying layers on the substrate. The layers contain an absorber layer and a reflection layer disposed on a top side of the absorber layer. Trenches and structures are formed in the layers using a short-wave optical radiation process and an adapted etching process.

The method according to the invention for fabricating a lithographic reflection mask, in particular for extremely small feature sizes below 100 nm, has the constructive advantage that the absorber layer is applied on the top side of the substrate below the reflection layer and/or on the side areas of the reflection layer. The above-mentioned disadvantages such as the undesired shadowing effects are largely avoided by virtue of the changed configuration of the reflection layer and the absorber layer, since now the patterned reflection layer can be projected onto the wafer in an undisturbed and image-faithful manner. The absorber layer produces no shadowing effects, or only greatly reduced shadowing effects, on account of the special configuration below the reflection layer and/or on the sidewalls of the reflection layer. In this case, what is regarded as particularly advantageous is that, moreover, no asymmetrical or significantly fewer asymmetrical intensity profiles of the reflected radiation arise, so that it is practically impossible for undesired asymmetrical resist structures to occur on the wafer. The reflection mask constructed in this way supports a stable projection process that, in production engineering use, advantageously ensures a high reliability during the patterning of the wafer.

Furthermore, it is regarded as particularly advantageous that it is possible to carry out defect repairs without degradation of the reflector layer in all those cases in which residues, bridges, particles, etc. led to non-resolved structures. The defects lie in the interspace between the structures produced in the reflector layer on a non-sensitive foundation, for example the mask substrate or the absorber layer at the bottom. This is not provided in the known fabrication methods for reflection masks, where defects or particles act as solid faults since generally they cannot be removed without damage to the reflector layer.

It is regarded as particularly advantageous that the reflection layer is a multilayer layer, two adjacent layers of a double layer in each case having different scattering and absorption properties. What is thereby achieved is that the layers—disposed in parallel—of the multilayer layer improve the total reflection of the multilayer layer relative to a single-layer reflection layer, because a large number of such double layers act as resonant reflectors of the incident radiation. The reflection of EUV radiation, for example, would be limited without such a multilayer layer.

It is advantageous, moreover, to choose the thickness of a layer of the reflection layer in a manner dependent on the wavelength of the radiation, with about 5 to 8 nm, preferably 6.8 nm. By way of example, in the case of a double layer made of Mo/Si and in the case of an EUV radiation of 13.4 nm, the reflection in the double layer is maximal since the layer thickness corresponds approximately to half the wavelength of the incident light.

Given a total thickness of the reflection layer in the range of 200–320 nm, 40 double layers each of 6.8 nm, for example, can be disposed in parallel. The reflection layer suffices for obtaining maximum reflection in conjunction with favorable production costs.

The absorber layer may be composed of the chemical elements such as Cr, Al, Ta, Ti, Ni or of the chemical compounds such as TaN or TiN. These materials can easily be deposited onto the substrate to a desired thickness and have advantageously high absorption properties in the case of the radiation provided.

It is also regarded as favorable to form the layer thickness of the absorber layer in the range from 20 to 80 nm. Sufficient absorption of the incident radiation is achieved with this layer thickness.

It is advantageous, moreover, to form a resist structure on the reflection layer with the aid of electron beam lithography. In this case, fine patternings can be implemented in a simple manner by irradiation with electrons and known photochemical processes.

A simple method for patterning the reflection layer with the resist structure can be reliably realized by anisotropic plasma etching.

It is also favorable to use the absorber layer as an etching stop. The etching process can therefore be continued until the reflection layer has been completely removed without any residues as far as the surface of the absorber layer, without disturbing residues of the reflection layer being left behind. The etching method is of functional importance in particular for the narrow distances between the small structures.

Suitable etching methods can be carried out using F-containing etching gases or Cl-containing etching gases with which only the reflection layer is removed.

The resist structure can advantageously be removed wet-chemically or in plasma, since these methods do not attack the reflection layer.

It is also regarded as favorable to sputter material of the absorber layer onto the sidewalls of the reflection layer by non-reactive ion etching. The deposition method covers the sidewalls of the patterned reflection layer in such a way that the incident radiation is completely absorbed and no radiation emerges at the side areas of the reflector structures.

A further alternative solution is also seen in the fact that a buffer layer is applied on the reflection layer. The buffer layer has the advantage that no deposition of absorber material takes place during a later selective chemical vapor deposition (CVD) process step on the buffer layer, so that the sidewalls of the patterned, electrically conductive reflection layer can be coated in a targeted manner.

The buffer layer is preferably formed from $SiO_2$. The buffer layer can advantageously be selectively removed for example wet-chemically using dilute hydrofluoric acid (HF) after the patterning of the reflection layer.

For the patterning of the buffer layer, a resist structure is advantageously applied, which is produced with the aid of electron beam lithography. In this way, it is possible to create even very small structures in the resist structure.

Furthermore, it is favorable to transfer the resist structure to the buffer layer by anisotropic and selective plasma etching. The buffer layer is thereby patterned in a simple manner.

During the patterning of the buffer layer, fault locations may be produced in the buffer structures, e.g. holes and interruptions, which, in principle, are repaired by an additive repair method consisting in the deposition of suitable materials such as $SiO_2$, without the multilayer layer being degraded.

By transferring the structure of the buffer layer to the reflection layer by anisotropic plasma etching (e.g. by RIE), the desired structures are advantageously formed in the reflection layer.

The use of, for example, $CF_4$, $CF_4/O_2$, $SF_6$, $Cl_2$, $Cl_2/O_2$ or $BCl_3/Cl_2$ is regarded as suitable etching gases for the patterning of the reflection layer. The etching gases enable selective etching of the reflection layer without the absorber layer being attacked. In this case, the absorber layer advantageously serves as an etching stop.

Furthermore, it is advantageous to deposit a further absorber layer on the sidewalls of the reflection layer by a selective CVD process. This reduces the radiation losses at the sidewalls of the reflection layer.

The layer thickness of the further absorber layer is advantageously chosen such that the radiation losses at the sidewalls are sufficiently reduced and, at the same time, the interspaces between two adjacent structures are filled as little as possible, thereby minimizing mechanical stresses in the reflection mask.

For the selective removal of the buffer layer, use is advantageously made of a wet-chemical etching step using dilute HF acid, so that the reflection layer or the absorber layer is not attacked.

A further alternative favorable embodiment is also seen in the fact that, instead of the absorber layer, the reflection layer is applied directly to the substrate. As a result, on the one hand, the work step for the application of the absorber layer to the substrate is obviated and, on the other hand, the substrate can be used for the absorption of the radiation.

It is also regarded as favorable to apply a buffer layer to the reflection layer, which buffer layer can be patterned by electron beam lithography with a resist structure.

The resist structure can advantageously be transferred to the buffer layer and subsequently to the reflection layer by anisotropic and selective plasma etching. The methods can be carried out in a simple manner.

For the application of the absorber layer on the sidewalls of the reflection layer, a selective CVD method is advantageously used since targeted depositions can be achieved by this method.

The reflection mask is preferably used for the EUV lithography of a semiconductor wafer, the EUV radiation lying in the range from 10 to 15 nm. The wavelength makes it possible to produce extremely small structures far below 100 nm.

It is an object of the invention to specify a method for fabricating a lithographic reflection mask and a lithographic reflection mask with which it is possible to produce, in particular, extremely small structures below 100 nm in production use on an industrial scale.

Other features which are considered as characteristic for the invention are set forth in the appended claims.

Although the invention is illustrated and described herein as embodied in a method for fabricating a lithographic reflection mask in particular for the patterning of a semiconductor wafer, and a reflection mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A to 3D are sectional views of individual production steps for the reflection mask according to a second known fabrication method;

FIGS. 4A to 4E are sectional views of individual production steps for the reflection mask according to a third known fabrication method;

FIGS. 8A to 8E are sectional views of individual production steps for a third exemplary embodiment of the reflection mask according to the invention.

DESCRIPTION OF THE PREFERRED EMBODIMENTS

Figures 1A, 1B, 1C, 1D:
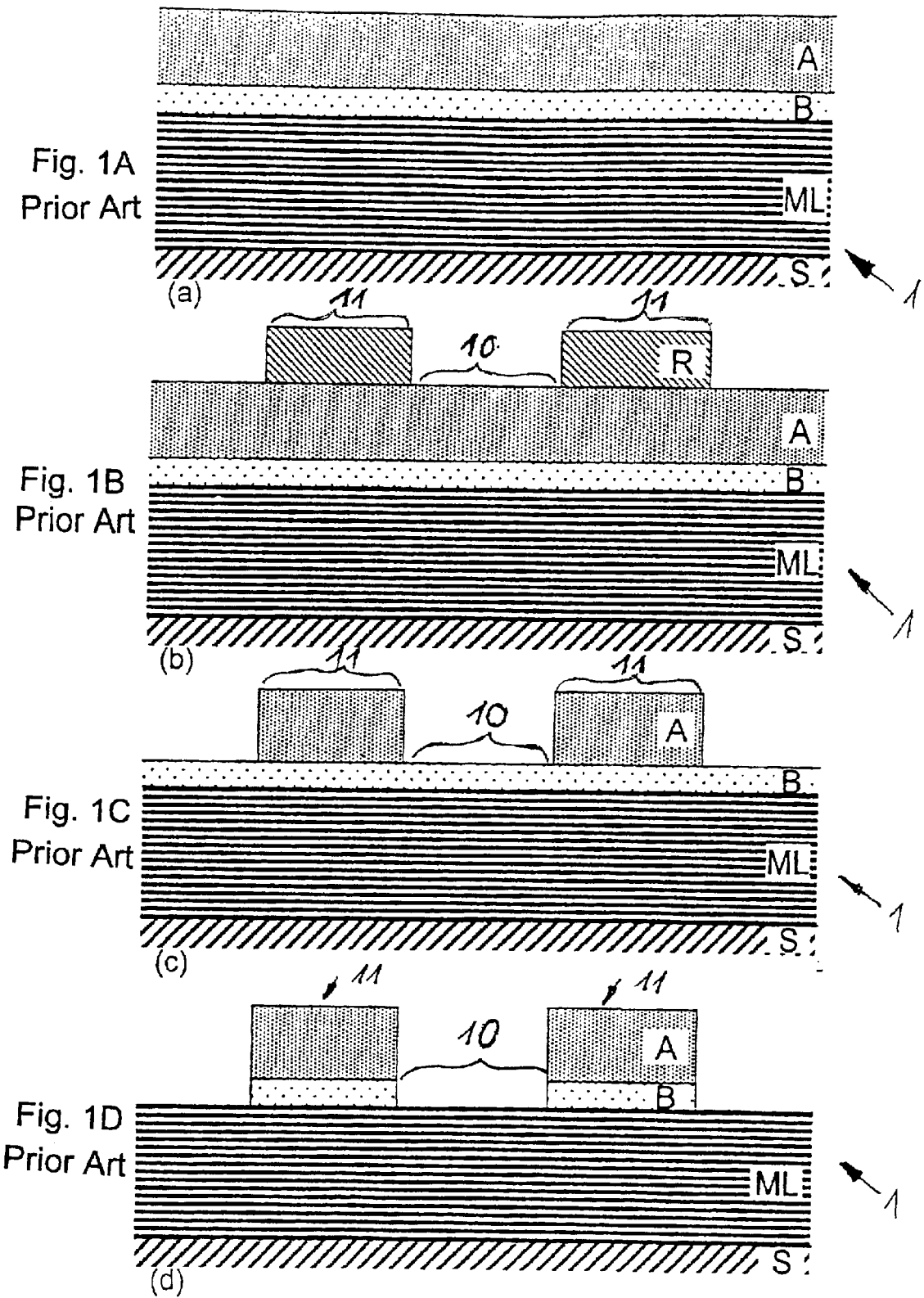
FIGS. 1A to 1D are diagrammatic, sectional views of individual production steps for a reflection mask according to a first known fabrication method.

In order to provide a better understanding of the invention, the known prior art with its problems will be explained in more detail. The miniaturization of structures which are intended to be produced in a dimension of from 70 to 35 nm requires lithographic reflection masks which can be used with a wavelength in the soft X-ray range from 10 to 15 nm.

Referring now to the figures of the drawing in detail and first, particularly, to FIGS. 1A to 1D thereof, there is shown, in a sectional view, a diagrammatic construction of a reflection mask 1, which can be created by an absorber etching process, for example. In this case, in accordance with FIG. 1A, a starting point is a substrate S composed, for example, of a quartz glass or ultra-low-expansion (ULE) material. A reflection layer ML, formed as a multilayer layer, is applied to the substrate S. The multilayer layer ML is formed with a multiplicity of thin layers, the layer thickness of an individual layer corresponding approximately to half the wavelength of the incident radiation. The layers are formed as double layers made of Mo and Si and are coordinated with the wavelength of the incident radiation in such a way that maximum reflection is achieved.

A buffer layer B, formed from $SiO_2$, is applied to the reflection layer ML. The buffer layer B has essentially production engineering grounds and serves, for example, as an etching stop during subsequent patterning processes and also as a protective layer for defect repairs.

An absorber layer A, usually composed of Cr, is subsequently applied to the buffer layer B.

For patterning, in accordance with FIG. 1B, a resist structure R (photoresist layer) is patterned by electron beam lithography, for example. In accordance with FIG. 1C, the structures of the resist layer R are transferred to the absorber layer A by a special etching method (RIE with etching stop), the structures of the resist layer R being removed by resist stripping. In this case, the buffer layer B serves for limiting the etching process of the absorber layer A.

In the status of the mask fabrication, it is possible to repair defects in an absorber structure 11 by a focused ion beam (FIB) or by a laser beam, without impairing the reflection layer ML. Accordingly, however, during the RIE patterning of the buffer layer B, it is neither permitted for the reflection layer ML to be damaged, for example on account of incipient etching, ion implantation or ion oxidation, nor is it permitted for defects such as residues, bridges or particles to be produced which are then generally no longer repairable without damaging the reflection layer ML.

FIG. 1D shows the finished etched reflection mask 1, in the case of which the buffer layer B has been patterned. FIG. 1D further reveals that the reflection layer ML bears on the substrate S in an undamaged and continuous manner. A reflection zone 10 between two structures 11 forms, for the later projection with EUV radiation, the area to be imaged (which is additionally reduced in size via a mirror optical arrangement) on the substrate or wafer. In contrast, the areas of the structures 11 absorb the impinging radiation virtually completely.

Figure 2:
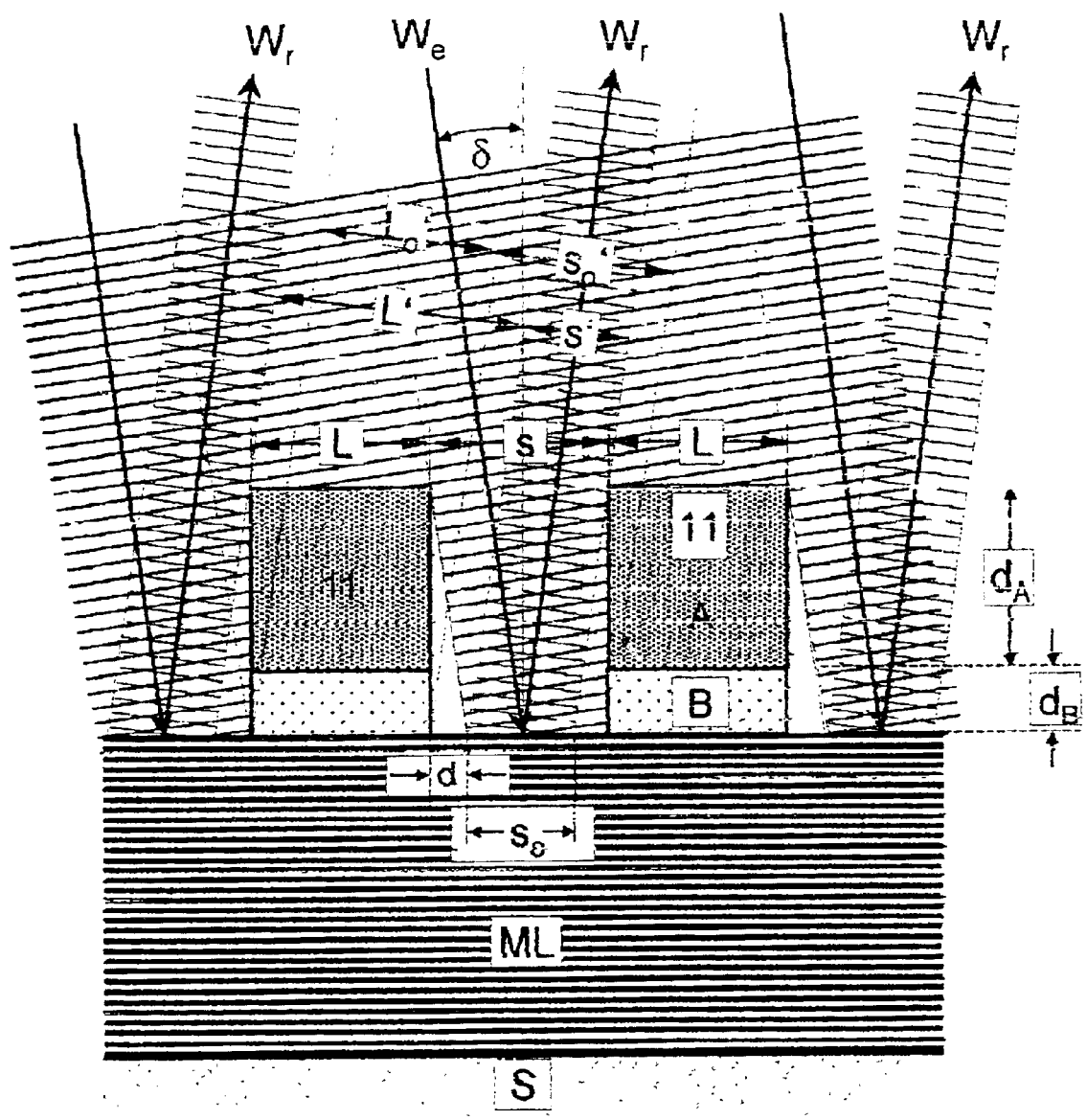
FIG. 2 is a sectional view through a typical EUV reflection mask according to the prior art.

The sectional diagram of FIG. 2 shows the basic action of the reflection mask 1 described in FIG. 1D. In particular, FIG. 2 reveals how an incident radiation $W_e$ is altered and reflected by the reflection layer ML as reflected radiation $W_r$. The radiation provided is an EUV radiation $W_e$ which has a wavelength of between 10 and 14 nm and impinges on the reflection mask 1 for example at an angle δ of incidence of 5°. The structures 11 formed by the two layers (the absorber layer A and the buffer layer B) have a spacing s (spacing of lines on the mask). Shadowing results in a shadow zone d, so that the effective reflection zone is correspondingly reduced in size. That is discernible through the reflected radiation $W_r$ with a width s' in the reflected aerial image with the topography depicted. Without topography, i.e. $d_A+d_B=0$, the reflected radiation $W_r$ would have a larger width $s_o'$ in comparison therewith.

The same also applies correspondingly to the structure width (line width L). With the topography, a width of the lines in the reflected aerial image changes to a value L', while it would have a value $L_o'$ without topography. With the illustrated topography, in particular, the reflected radiation $W_r$ is limited by the projecting left-hand edge of the right-hand structure 11 of the absorber A, so that the effective reflection zone of the reflected radiation $W_r$ is reduced in size. Furthermore, it is disadvantageous that different radiation densities are produced as a result of interference at the edge regions of the radiation zone of the reflected radiation $W_r$.

FIG. 2 further reveals that the distance L' between two adjacent reflected radiation beams $W_r$ is greater than the width L of the structure 11 itself. From geometrical considerations and the simplified assumption that the incident EUV radiation $W_e$ is reflected at the surface of the reflection layer ML, it follows that the CD changes are equal to $$2*(d_A+d_B)*\sin \delta$$

where $d_A$ and $d_B$ are the layer thicknesses of the absorber A and buffer B, respectively. δ is the angle of incidence with respect to the normal to the mask. Typical values for $d_A=70$ nm and $d_B=50$ nm yield CD changes of 21 nm, that is to say of approximately 10% for 200 nm structures on the reflection mask 1. Given a miniaturization ratio of 4:1, CD changes of 5 nm are still produced on the wafer.

In practice, however, larger CD changes must be expected since the radiation $W_e$ penetrates into the reflection layer ML and is scattered with decreasing intensity at the deeper layers, so that the reflected radiation $W_r$ produced by interference is not only shadowed to a greater extent but is also offset relative to the beam reflected at the surface.

A further disadvantage is that the structure displacements likewise depend on the layer topography, that is to say essentially on the thickness of the absorber and buffer layers.

It is also disadvantageous that different thermal expansion coefficients of the mask substrate S, of the reflection layer ML, of the buffer layer B and of the absorber layer A result in mechanical stresses and distortions which likewise lead to CD changes. Moreover, it must be expected that the stresses relax as a result of structure changes in the reflection layer ML, as a result of recrystalization and diffusion and the reflectivity of the reflection layer ML is reduced in the process.

FIGS. 3A to 3D show a second exemplary embodiment of the reflection mask 1 which has been fabricated according to the damascene method. According to FIG. 3A, the starting point is once again the substrate S, on which the reflection layer ML is applied. As in all further examples presented, the reflection layer ML is always formed as a multilayer reflection layer.

The resist structure R is applied to the reflection layer ML and is patterned with trenches and holes by electron beam lithography. The structures 11 are transferred to the reflection layer ML by an anisotropic etching method. The depth of the trenches and holes may be less than or equal to the thickness of the reflection layer ML. After the removal of the resist structure R, in accordance with FIG. 3C, the trenches and holes are filled with the absorber material A. Excess absorber material A is removed by chemical mechanical polishing (CMP), so that the trenches and holes are filled by the absorber material and produce a planar surface. In this case, there is a considerable risk of the multilayer layer ML being damaged by the CMP step and its reflectivity being reduced.

In the reflection mask 1, too, the above-mentioned CD changes arise, although their effects are smaller due to the smaller topography differences. The CD changes arise because the EUV radiation is reflected not only at the topmost layer of the reflection layer ML but also at deeper layers.

In the case of the reflection mask 1, it is also disadvantageous that the effects due to different thermal effects even occur in an intensified fashion since the absorber material is not only situated on the surface of the reflection layer ML but also fills the trenches and holes without any cavities. As a result, high local mechanical stresses are produced in the reflection layer ML.

FIGS. 4A to 4E show a further exemplary embodiment of a known fabrication method for the reflection mask 1, in which the risks of degradation of the multilayer layer are intended to be avoided by the CMP step. Proceeding from the substrate S, in accordance with FIG. 4A, the buffer layer B is applied on the reflection layer ML. The buffer layer B is patterned in the manner described above. FIGS. 4B and 4C show the corresponding situation to that described for FIGS. 3B and 3C. In accordance with FIG. 4D, the excess absorber A is removed by chemical mechanical polishing (CMP step), the CMP step stopping on the buffer layer B. After the wet- or dry-chemical selective removal of the buffer layer B, in accordance with FIG. 4E, a topography with the disadvantageous effects described above is produced. In this method, too, the undesired CD changes occur.

Figure 5:
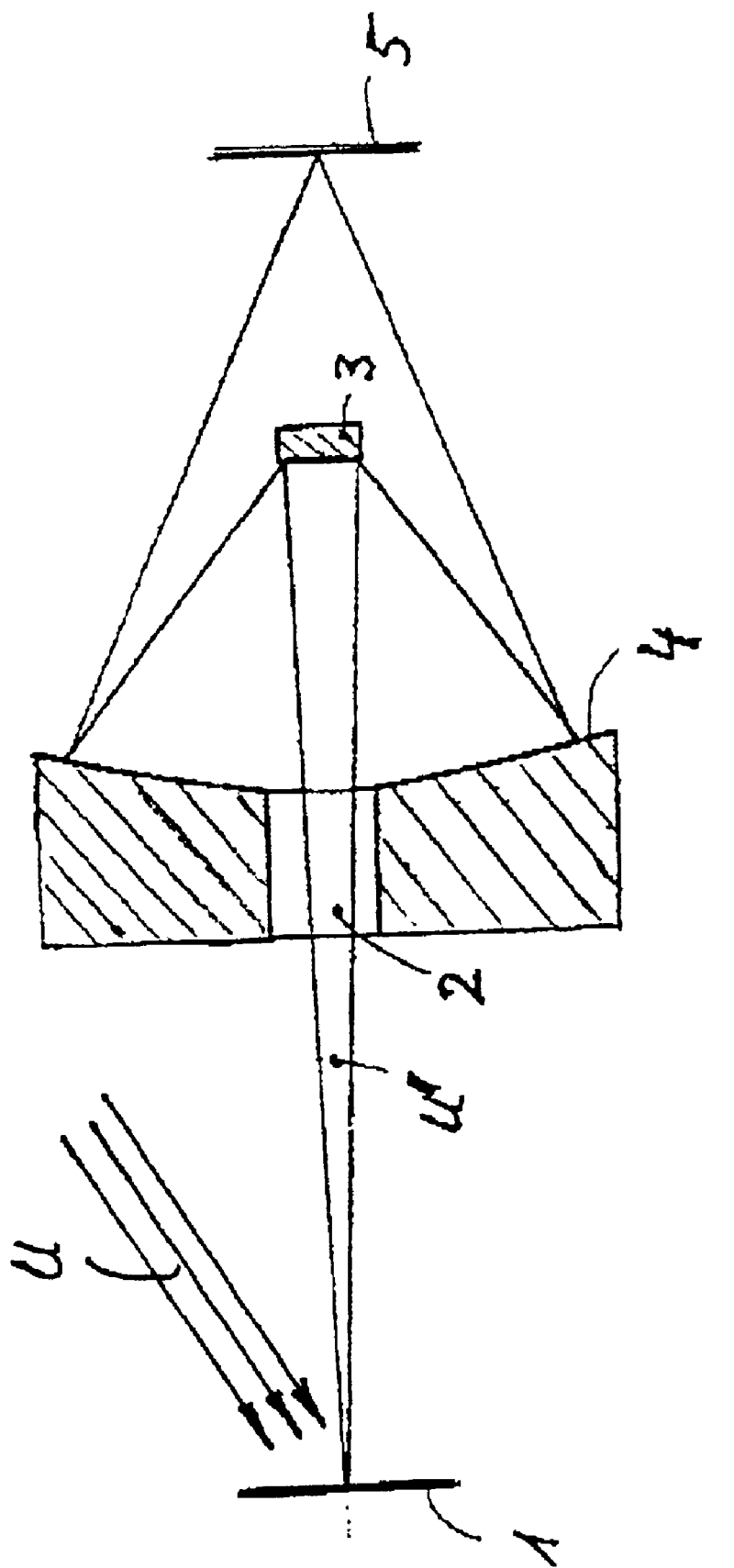
FIG. 5 is an illustration of a simple camera system that has already been used for basic examinations.

In order to provide a better understanding of the function of the projection, FIG. 5 shows, in a diagrammatic elucidation, a simplified camera system in which an obliquely incident radiation U (EUV radiation) is reflected by the reflection mask 1 and conducted as reflected radiation U' through an aperture 2. The reflected radiation U' is deflected by two spherical mirrors 3 and 4 in such a way that the radiation is focused onto a semiconductor wafer 5 with a predetermined reduction ratio.

The disadvantages presented above in the case of known fabrication methods for reflection masks do not occur, or only occur to a greatly reduced extent, in the case of the exemplary embodiments of the invention described below. That is due essentially to a new layer configuration, according to the invention, for the reflection layer ML and the absorber layer A. The absorber layer A is in principle disposed not on the reflection layer ML but below the latter and is alternatively applied on the substrate S and/or the sidewalls of the reflection layer ML. As a result, the effects on the reflected radiation $W_r$ (see FIG. 2) are completely different. The disadvantages described in the case of the prior art, in particular of the CD changes, are thereby advantageously avoided or reduced.

A first exemplary embodiment according to the invention is shown by FIGS. 6A to 6D. According to FIG. 6A, the starting point is the substrate S for the mask 1, the substrate S being composed of quartz or ULE, for example. The absorber layer A is deposited onto the substrate S for example with a thickness in a range from 20 to 80 nm. The absorber layer A is composed, for example, of Cr, Al, Ta, TaN, Ti, TiN or Ni. The reflection layer ML is applied to the absorber layer A, the total thickness lying in a range from 200 to 320 nm. By way of example, a total thickness of approximately 270 nm results in the case of 40 double layers.

The reflection layer ML is constructed as a multilayer layer similarly to that described above. It has, for example, double layers made of Mo/Si each with a thickness of 6.8 nm, the thickness of a double layer essentially being determined by the wavelength of the EUV radiation U used. In the case of the optical wavelengths provided, the thickness of a layer will lie in the range from 5 to 8 nm.

Figure 6A:
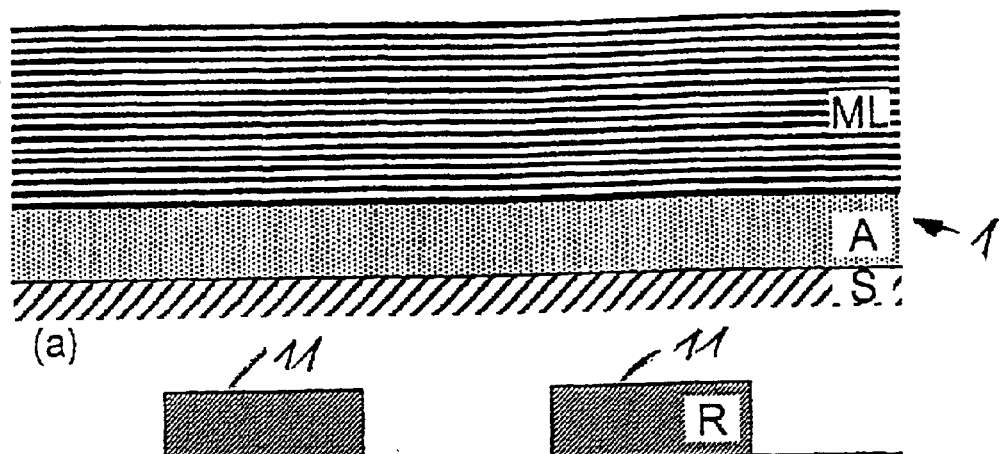
FIGS. 6A to 6F are sectional views of individual production steps for a first exemplary embodiment of the reflection mask according to the invention.
Figure 6B:
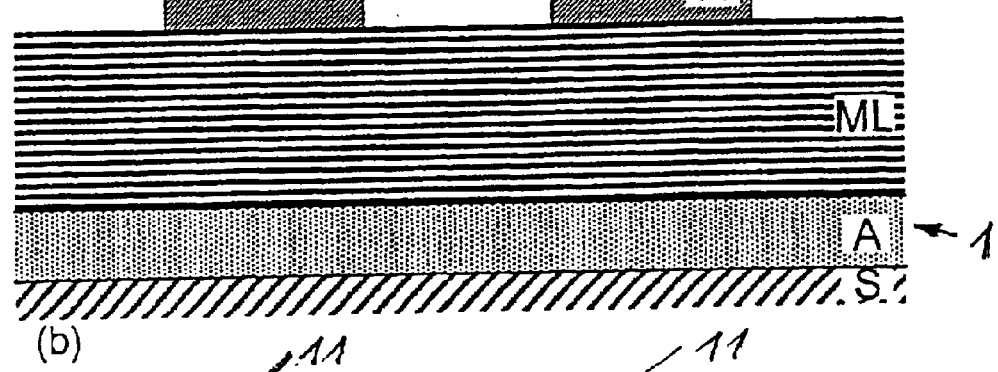
Figure 6C:
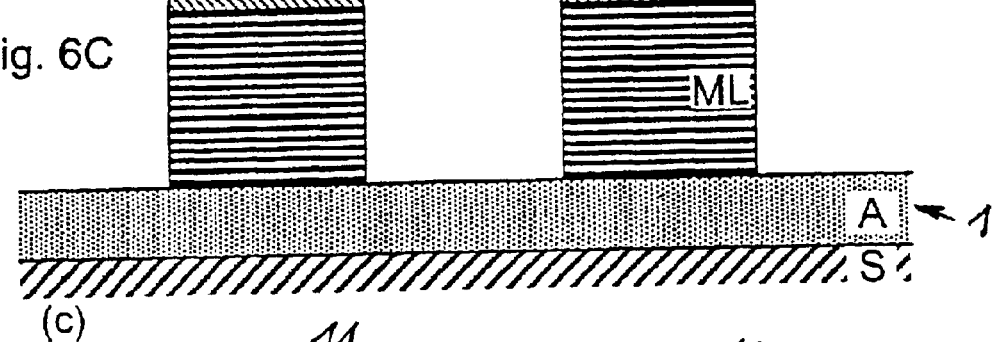

In accordance with FIG. 6B, the reflection layer ML has applied to it a resist layer R made of suitable photoresist, in which the structures 11 are formed by electron beam lithography. According to FIG. 6C, the reflection layer ML is patterned with the structure of the resist layer R by anisotropic plasma etching, for example by RIE, MERIE or ICP using F-containing gases or Cl-containing gases such as $CF_4$, $CF_4/O_2$, $SF_6$, $Cl_2$, $CL_2/O_2$ or $BCl_3/Cl_2$. In this case, the absorber layer A serves as an etching stop.

Figure 6D:
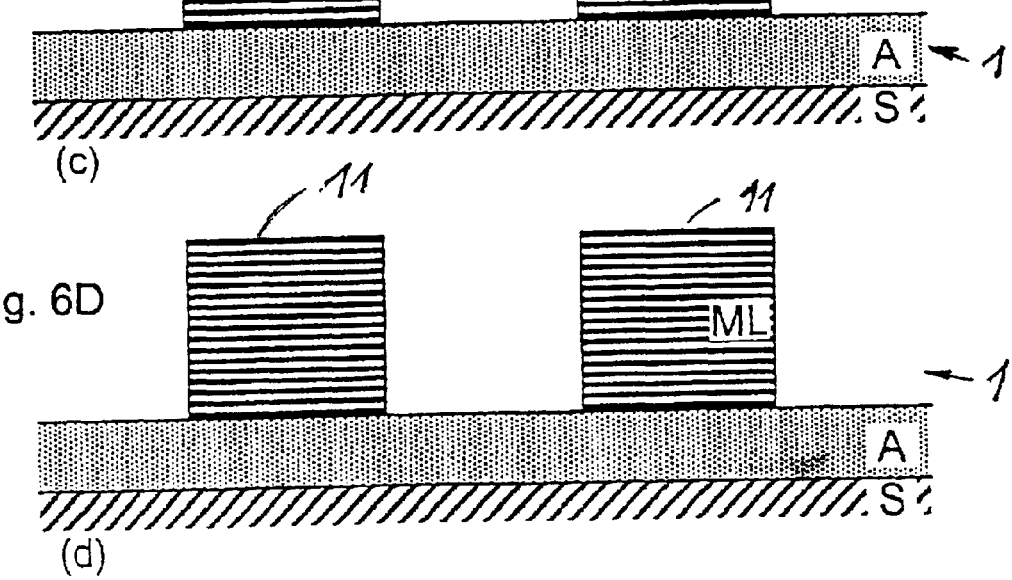

In FIG. 6D, the remaining resist structure R has subsequently been removed in a wet-chemical and/or plasma etching method. During the resist stripping, in plasma, care must be taken to ensure through a suitable choice of the process parameters and etching gases that the reflection layer ML is not oxidized or is only oxidized at the surface.

After these few processing steps, the reflection mask 1 is already finished and can be used as EUVL mask for EUV lithography. What is also advantageous in addition to the low process complexity and the possibility of being able to remove defects between the reflector structures 11 without damaging the latter is the fact that the above-mentioned asymmetry of the reflected radiation is reduced by the exit of radiation at the side areas of the structures. What is unfavorable, however, is that the radiation background rises overall, but the exposure contrast of the resist does not.

However, the quantitative assessment of these effects can be determined experimentally and/or by simulation and be taken into account correspondingly.

Figure 6E:
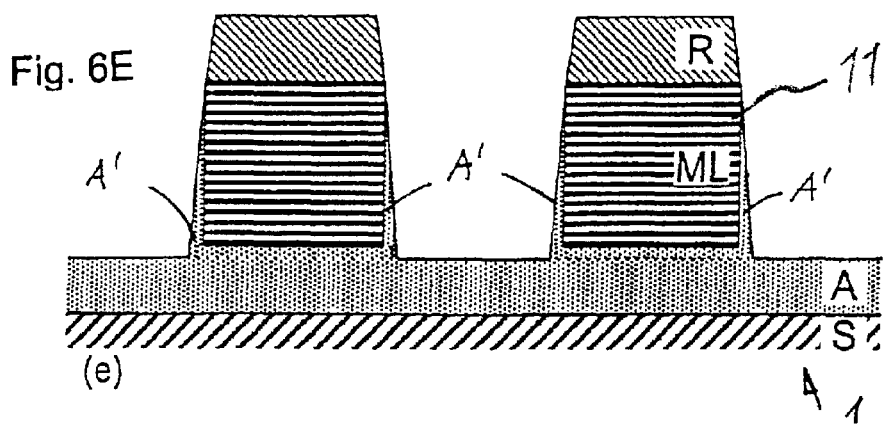

In order to avoid intensity losses, an alternative development of the invention proposes that a further absorber layer A' be disposed on side areas of the structures 11. The further absorber layer A' is formed for example according to FIG. 6E by non-reactive ion etching, for example using Ar. In this case, material from the absorber layer A is sputtered onto the sidewalls, thereby producing the further absorber layer A'.

Figure 6F:
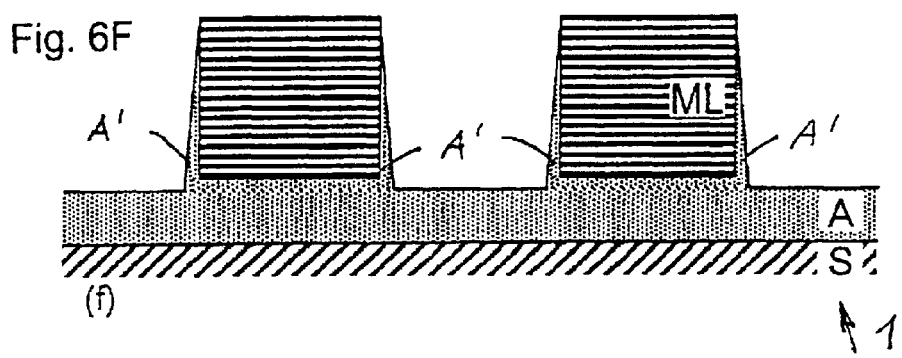

The remaining disturbing resist structure R is subsequently removed by resist stripping according to FIG. 6F. No intensity losses can now occur from the sidewalls of the structures 11.

Residues that have possibly remained, so-called "fences" made of absorber material that were deposited on sidewalls of the resist structures R, are removed wet-chemically or mechanically by CMP touch-up or water jets with laser assistance (water jet laser cleaning).

The application example can be modified as required by—as in the case of the second exemplary embodiment described below—the buffer layer B being applied to the multilayer reflection layer ML before the lithographic step. This layer allows the repair of imperfections (holes, interruptions) in the buffer structures that have been caused by the lithographic patterning, without degrading the multilayer layer ML.

A second exemplary embodiment of the invention is illustrated in FIGS. 7A to 7E. In contrast to the reflection mask 1 described above, the buffer layer B is additionally applied on the reflection layer ML in accordance with FIG. 7A. The configuration of the absorber layer A and of the reflection layer ML on the substrate S is the same as described above in FIGS. 6A to 6F.

Quartz or ULE material was again used as the substrate S. The absorber layer is applied to the substrate S and is composed, for example, of Cr, Al, Ta, TaN, Ti, TiN or Ni with a thickness of 20 to 80 nm. A multilayer layer is again applied as reflection layer ML to the absorber layer A. By way of example, 40 MO/Si double layers each with a thickness of 6.8 nm are applied, resulting in a total thickness of approximately 270 nm. Finally, the buffer layer B made, for example, of $SiO_2$ is deposited onto the reflection layer ML. The thickness of the buffer layer B is 50 nm, for example.

Figure 7A:
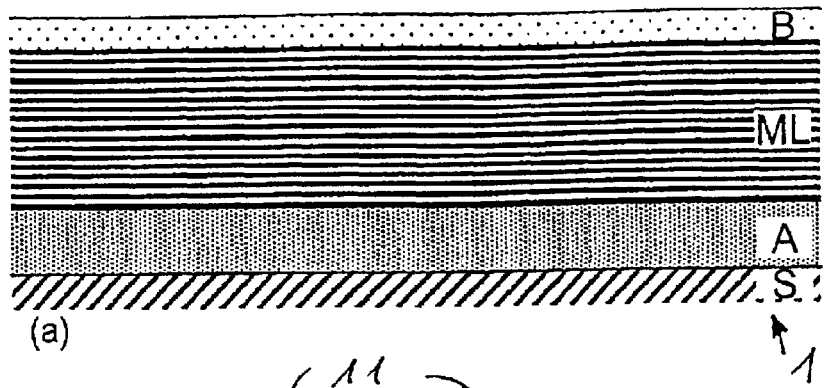
FIGS. 7A to 7E are sectional views of individual production steps for a second exemplary embodiment of the reflection mask according to the invention.
Figure 7B:
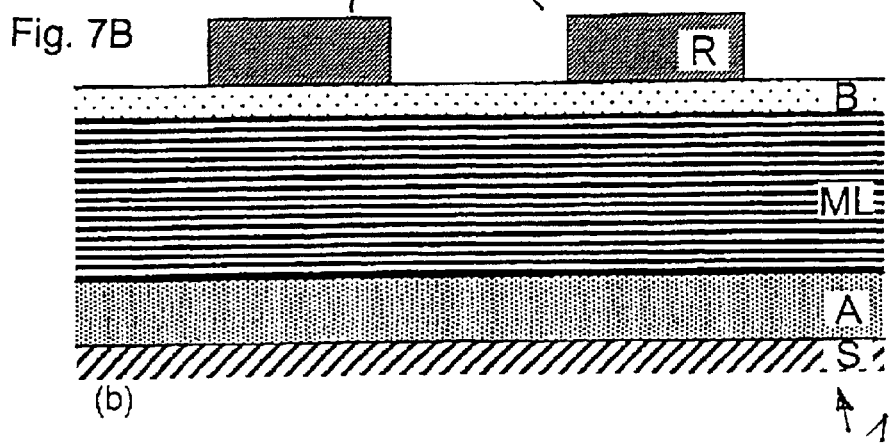
Figure 7C:
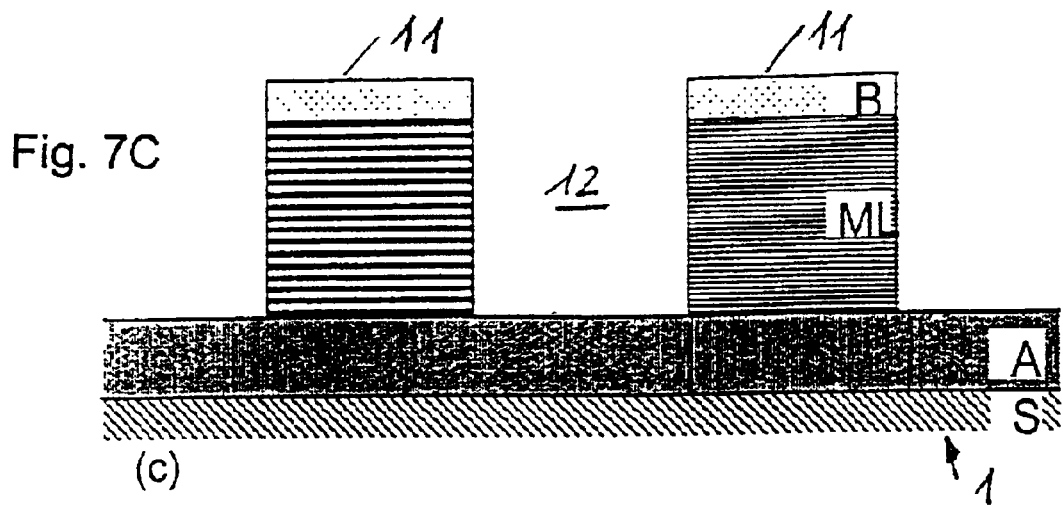

According to FIG. 7B, the resist structure R is then produced on the buffer layer B by electron beam lithography. The resist structure R is patterned by anisotropic and selective plasma etching, for example by RIE, MERIE or ICP using e.g. $CHF_3/CF_4$ gas mixtures. First, the structure 11 is transferred to the buffer layer B and then to the reflection layer ML (FIG. 7C), as has been described above. Etching gases such as $CF_4$, $CF_4/O_2$, $SF_6$, $Cl_2$, $Cl_2/O_2$ or $BCl_3/Cl_2$ can be used for the etching step. Depending on the choice of etching gases, the absorber layer A lying below the reflection layer ML is not attacked by the etching gases or is attacked so little that a sufficient residual thickness is left behind. Afterward, the resist structure R is removed wet-chemically and/or in plasma, so that the structure 11 of FIG. 7C is obtained.

Figure 7D:
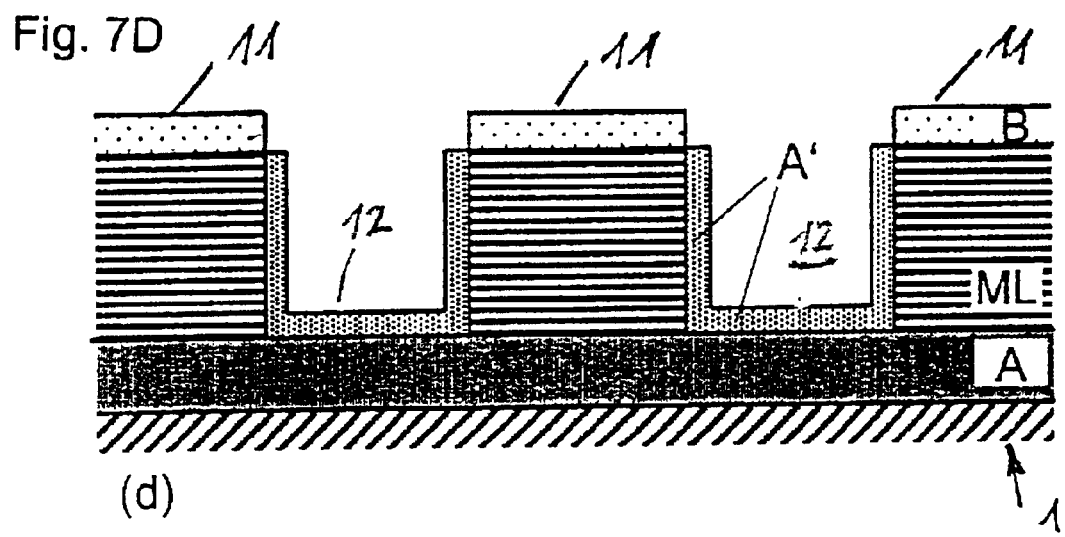

In FIG. 7D, the further absorber layer A' is applied by a selective CVD step on the sidewalls of the structures 11, the conductive foundation previously having been freed of insulating passivations. The further absorber layer A' is essentially composed of Al. The layer thickness of the further absorber layer A' is chosen such that radiation losses at the sidewalls of the structures 11 are sufficiently reduced. However, the interspaces of the trenches 12 are filled as little as possible. By way of example, the further absorber layer A' is deposited in a range from 30 to 50 nm.

Figure 7E:
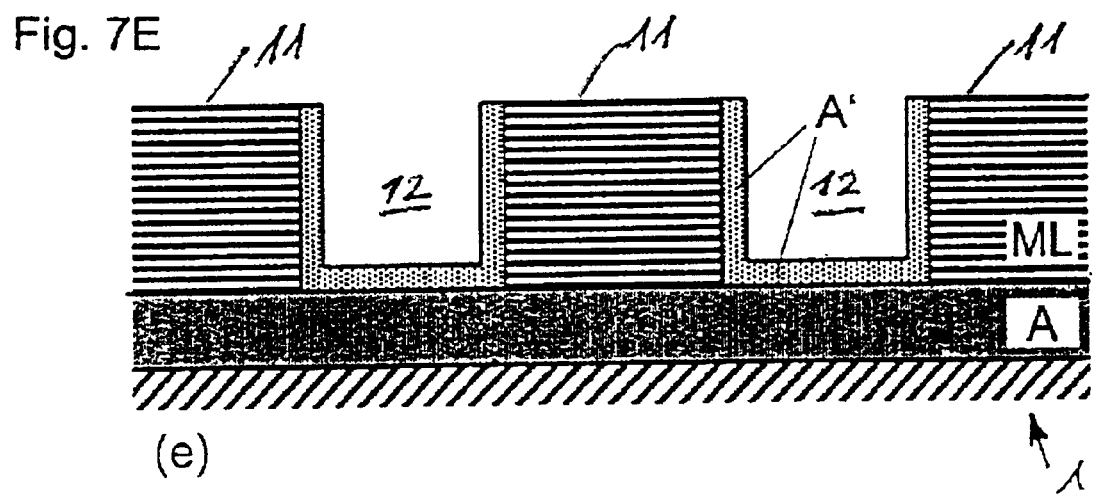

Finally, FIG. 7E shows the finished reflection mask 1 after the buffer layer B has been removed selectively with respect to the reflection layer ML and with respect to the further absorber layer A'. The removal is effected for example wet-chemically using dilute HF acid.

The etching methods specified have already been explained in more detail with respect to the prior art, so that they need not be repeated in detail at this point.

A third exemplary embodiment of the invention is shown by FIGS. 8A to 8E. According to FIG. 8A, the starting point is once again the substrate S composed of quartz or ULE material. In this case, however, no absorber layer A is applied to the substrate S. Rather, the reflection layer ML is applied directly to the substrate S. In this case, too, the reflection layer ML has, for example, 40 double layers Mo/Si with a thickness of 6.8 nm in each case, so that it has a total thickness of approximately 270 nm. The buffer layer B with a thickness of 50 nm, for example, is deposited onto the reflection layer ML. The layer configuration now serves as a starting material for the patterning of the reflection mask 1.

FIG. 8B shows the patterned reflection mask 1, in the case of which an applied resist structure R has been formed according to the methods described above, for example by electron beam lithography. The structure has been transferred to the buffer layer B and the reflection layer ML. The transfer is affected in the manner described above, for example by anisotropic and selective plasma etching by RIE, MERIE, ICP using $CHF_3/CHF_4$ gas mixtures. In this case, $CF_4$, $CF_4/O_2$, $SF_6$, $Cl_2$, $Cl_2/O_2$ or $BCl_3/Cl_2$ may be used as etching gases. Trenches 12 produced between the structures 11 reach down to the substrate S. In this case, the substrate S serves as an etching stop. The addition of the absorber layer A disposed on the substrate S is not necessary.

FIG. 8C shows the state of the reflection mask 1 after the resist structure R has been removed, so that only the reflection layer ML with the buffer layer B have remained on the substrate S.

In order to reduce the reflection losses at the sidewalls of the reflection layer ML, the absorber layer A is applied according to FIG. 8D. The absorber layer A, composed of Al, for example, is applied by a selective CVD step on the side areas of the structures 11, after the foundation, as already mentioned, has been made conductive. No absorber layer A is applied in the trenches 12 on the substrate S itself, however, since the substrate S is not conductive at the free locations. That is also not absolutely necessary since the substrate S, owing to its large thickness, reliably absorbs the penetrating EUV radiation.

The layer thickness of the absorber layer A is chosen such that the radiation losses at the sidewalls of the structures 11 are sufficiently reduced. On the other hand, the interspaces of the trenches 12 are intended to be filled as little as possible. Experience shows that layer thicknesses of 30 to 50 nm are sufficient.

In a final step, in accordance with FIG. 8E, the buffer layer B is removed selectively with respect to the reflection layer ML and with respect to the absorber layer A. This can be done for example wet-chemically using dilute HF acid.

The reflection masks 1 produced by the three fabrication methods described above may preferably be used for the masking of chips on semiconductor wafers. The masks 1 are suitable in particular for EUV lithography in which a radiation in the range from 10 to 15 nm is used. Using a corresponding camera (stepper) and suitable size-reduced projection, it is expected that structures down to a minimum size of approximately 35 nm will be able to be produced on the wafer.

I claim:

1. A method for fabricating a lithographic reflection mask, which comprises the steps of:
   providing a substrate;
   applying layers on the substrate, the layers include an absorber layer and a reflection layer disposed on a top side of the absorber layer; and
   forming trenches in the reflection layer, extending to absorber layer, using a short-wave optical radiation process and an etching process.

2. The method according to claim 1, which comprises forming the reflection layer as a multilayer layer, two adjacent layers in the multilayer layer in each case having different scattering and absorption properties.

3. The method according to claim 2, which comprises setting a thickness of a layer of the multilayer layer in a manner dependent on a wavelength in a range from 5 to 8 nm.

4. The method according to claim 3, which comprises setting the thickness of the layer of the multilayer layer to be 6.8 nm.

5. The method according to claim 2, which comprises setting a total thickness of the reflection layer in a range from 200 to 320 nm.

6. The method according to claim 1, which comprises forming the absorber layer from chemical elements and compounds selected from the group consisting of Cr, Al, Ta, Ti, Ni, TaN, and TiN.

7. The method according to claim 1, which comprises forming a layer thickness of the absorber layer to be a range from 20 to 80 nm.

8. The method according to claim 1, which comprises forming a resist structure on the reflection layer using an electron beam lithography process.

9. The method according to claim 8, which comprises using the resist structure as an etching mask for the reflection layer, and patterning the reflection layer using an anisotropic plasma etching process.

10. The method according to claim 9, which comprises using the absorber layer as an etching stop.

11. The method according to claim 10, which comprises using one of a F-containing etching gas and a Cl-containing etching gas for etching.

12. The method according to claim 11, which comprises removing the resist structure by one of a wet-chemical process and a plasma process.

13. The method according to claim 12, which comprises sputtering material of the absorber layer onto sidewalls of the reflection layer.

14. The method according to claim 1, which comprises applying a buffer layer to the reflection layer.

15. The method according to claim 14, which comprises forming the buffer layer from $SiO_2$.

16. The method according to claim 14, which comprises producing a resist structure on the buffer layer using an electron beam lithography process.

17. The method according to claim 16, which comprises transferring the resist structure to the buffer layer by anisotropic and selective plasma etching.

18. The method according to claim 17, which comprises transferring the resist structure to the reflection layer.

19. The method according to claim 18, which comprises using an etching gas selected from the group consisting of $CF_4$, $CF_4/O_2$, $SF_6$, $Cl_2$, $Cl_2/O_2$ and $BCl_3/Cl_2$.

20. The method according to claim 18, which comprises using the absorber layer as an etching stop.

21. The method according to claim 20, which comprises removing the resist structure by one of a wet-chemical process and a plasma process.

22. The method according to claim 21, which comprises applying a further absorber layer by a selective chemical vapor deposition process on sidewalls of the reflection layer and etched-free zones of the absorber layer.

23. The method according to claim 22, which comprises setting a thickness of the further absorber layer such that radiation losses at the sidewalls of the reflection layer are sufficiently reduced and in a range from 30 to 50 nm.

24. The method according to claim 23, which comprises removing the buffer layer selectively with respect to the reflection layer and the further absorber layer.

25. The method according to claim 24, which comprises using a wet-chemical process with a dilute HF acid for removing the buffer layer selectively with respect to the reflection layer and the further absorber layer.

26. The method according to claim 1, which comprises using the lithographic reflection mask for setting a feature size to be below 100 nm on a wafer.

27. A method for fabricating a lithographic reflection mask, which comprises the steps of:
   providing a substrate;
   applying a reflection layer on the substrate; and
   forming trenches in the reflection layer, that extend to the substrate, using a short-wave optical radiation process and an etching process.

28. The method according to claim 27, which comprises:
performing the following steps before performing the forming of the trenches and structures step:
applying a buffer layer on the reflection layer; and
forming a resist structure on the buffer layer using an electron beam lithography process; and
performing the forming of the trenches and structures step by forming the trenches and the structures in the buffer layer and in the reflection layer.

29. The method according to claim 28, which comprises transferring the resist structure first to the buffer layer and subsequently to the reflection layer by anisotropic and selective plasma etching.

30. The method according to claim 29, which comprises depositing an absorber layer on sidewalls of the reflection layer defining the trenches by a selective chemical vapor deposition process.

31. The method according to claim 30, which comprises removing the buffer layer selectively using a wet-chemical etching process.

32. The method according to claim 30, which comprises forming the absorber layer from chemical elements and compounds selected from the group consisting of Cr, Al, Ta, Ti, Ni, TaN, and TiN.

33. The method according to claim 30, which comprises forming a layer thickness of the absorber layer to be a range from 20 to 80 nm.

34. The method according to claim 27, which comprises forming the reflection layer as a multilayer layer, two adjacent layers in the multilayer layer in each case having different scattering and absorption properties.

35. The method according to claim 34, which comprises setting a thickness of a layer of the multilayer layer in a manner dependent on a wavelength in a range from 5 to 8 nm.

36. The method according to claim 35, which comprises setting the thickness of the layer of the multilayer layer to be 6.8 nm.

37. The method according to claim 34, which comprises setting a total thickness of the reflection layer in a range from 200 to 320 nm.

38. A lithographic reflection mask, comprising:
a substrate;
an absorber layer disposed on said substrate; and
a reflection layer disposed on said absorber layer, said reflection layer having trenches formed therein that extend to said absorber layer.

39. The lithographic reflection mask according to claim 38, wherein the lithographic reflection mask can be used for extreme ultraviolet region lithography of a semiconductor wafer with an optical radiation in a range from 10 to 15 nm.

40. A lithographic reflection mask, comprising:
a substrate;
a first absorber layer disposed on said substrate;
a reflection layer disposed on said first absorber layer and having trenches formed therein defined by sidewalls of said reflection layer, said trenches extending to said first absorber layer; and
a second absorber layer disposed on said sidewalls of said reflection layer.

41. The lithographic reflection mask according to claim 40, wherein the lithographic reflection mask can be used for extreme ultraviolet region lithography of a semiconductor wafer with an optical radiation in a range from 10 to 15 nm.

42. A lithographic reflection mask, comprising:
a substrate;
a reflection layer disposed on said substrate and having trenches formed therein defined by sidewalls of said reflection layer, said trenches extending to said substrate; and
an absorber layer disposed on said sidewalls of said reflection layer.

43. The lithographic reflection mask according to claim 42, wherein the lithographic reflection mask can be used for extreme ultraviolet region lithography of a semiconductor wafer with an optical radiation in a range from 10 to 15 nm.

* * * * *